United States Patent
Kitagawa

(10) Patent No.: US 7,253,623 B2
(45) Date of Patent: Aug. 7, 2007

(54) MAGNETIC RESONANCE IMAGING APPARATUS AND MAGNETIC FIELD FORMING APPARATUS

(75) Inventor: Seiichi Kitagawa, Tokyo (JP)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

(21) Appl. No.: 11/438,835

(22) Filed: May 23, 2006

(65) Prior Publication Data

US 2007/0035297 A1 Feb. 15, 2007

(30) Foreign Application Priority Data

May 25, 2005 (JP) .............................. 2005-152130

(51) Int. Cl.
*G01V 3/00* (2006.01)
(52) U.S. Cl. ........................................ 324/318; 324/319
(58) Field of Classification Search ........ 324/300–322; 600/407–445
See application file for complete search history.

(56) References Cited

U.S. PATENT DOCUMENTS

| | | | |
|---|---|---|---|
| 5,548,653 A * | 8/1996 | Pla et al. .................... | 381/71.2 |
| 5,617,026 A * | 4/1997 | Yoshino et al. ............. | 324/318 |
| 6,107,799 A | 8/2000 | Sellers et al. | |
| 6,224,341 B1 | 5/2001 | Fricke | |
| 6,549,010 B2 * | 4/2003 | Roozen et al. .............. | 324/318 |
| 6,552,543 B1 | 4/2003 | Dietz | |
| 6,564,900 B1 | 5/2003 | Dean et al. | |
| 6,717,497 B2 | 4/2004 | Atkins | |
| 6,810,990 B2 | 11/2004 | Dean et al. | |
| 6,853,282 B2 | 2/2005 | Kuth | |
| 6,882,152 B2 | 4/2005 | Schuster et al. | |
| 6,894,497 B2 | 5/2005 | Renz | |

* cited by examiner

*Primary Examiner*—Brij B. Shrivastav
(74) *Attorney, Agent, or Firm*—Armstrong Teasdale LLP

(57) ABSTRACT

Occurrence of noise is to be prevented, and image quality improved. Dynamic dampers which damp vibration attributable to the gradient coil unit are arranged in positions which are extending areas of a gradient coil unit extending to protrude out of an accommodating space, and are different in positions from the accommodating space.

8 Claims, 4 Drawing Sheets

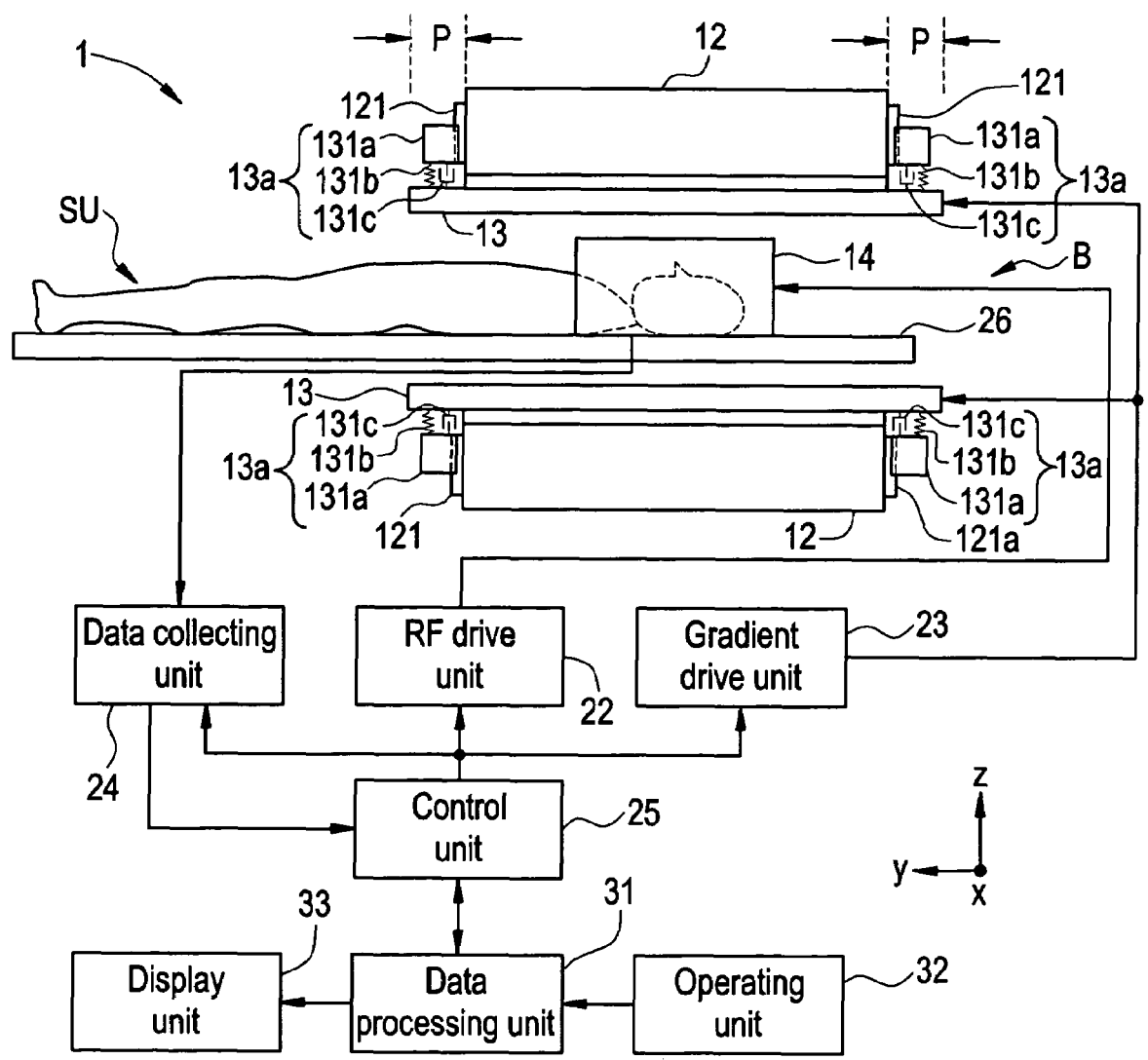

MAGNETIC RESONANCE IMAGING APPARATUS AND MAGNETIC FIELD FORMING APPARATUS

CROSS REFERENCE TO RELATED APPLICATIONS

This application claims the benefit of Japanese Application No. 2005-152130 filed May 25, 2005.

BACKGROUND OF THE INVENTION

The present invention relates to a magnetic resonance imaging apparatus and a magnetic field forming apparatus, and more particularly to a magnetic resonance imaging apparatus which generates an image of a subject on the basis of magnetic resonance signals from the subject in an accommodating space in which a magnetostatic field is formed, and a magnetic field forming apparatus which forms a gradient magnetic field in the accommodating space wherein the subject is accommodated and the magnetostatic field is formed.

A magnetic resonance imaging (MRI) apparatus is known as an apparatus which can pick up sectional images of a subject by utilizing a nuclear magnetic resonance (NMR) phenomenon. Magnetic resonance imaging apparatuses are used in many different fields including medical applications and industrial applications.

When sectional images of a subject are to be picked up by using a magnetic resonance imaging apparatus, first the subject is placed in an accommodating space in which a magnetostatic field is formed, and the spinning direction of protons in the subject are aligned in the direction of the magnetostatic field to achieve a state in which a magnetization vector is obtained. After that, a nuclear magnetic resonance phenomenon is generated by irradiation with an electromagnetic wave of the resonance frequency, and the magnetization vector of the protons is thereby varied. And the magnetic resonance imaging apparatus receives magnetic resonance signals from the protons returning to their original magnetization vector, and generates a sectional image of the subject on the basis of the received magnetic resonance signals.

For such magnetic resonance imaging apparatuses, pulse sequences for switching the gradient magnetic field at high speed, such as the high speed EPI method, have been developed to meet the need for reducing the image pickup time. In forming a gradient magnetic field by high speed switching, mechanical distortions arise in the gradient coil to invite vibration as an electromagnetic force works on the gradient coil at the time of rising or of inverting. This vibration may give rise to noise or deteriorate the image quality.

For this reason, vibration attributable to the gradient coil in magnetic resonance imaging apparatuses is suppressed by using a dynamic damper (cf. for instance Patent Document 1 and Patent Document 2).

[Patent Document 1] JP-A No. Hei 3-32643
[Patent Document 2] JP-A No. Hei 6-90919

Here, the dynamic damper is so arranged, in an accommodating space in which a subject and a gradient coil are accommodated, as to be held between the gradient coil and a magnetostatic field magnet.

For this reason, no sufficient space can be secured for installing the dynamic damper, and accordingly the mass of the weight of the dynamic damper cannot be increased, sometimes making it impossible to adequately suppress the vibration attributable to the gradient coil. Further, in order to complexly prevent the vibration of behavior in a plurality of natural vibration modes, it is necessary to perform adjustment of the supporting rigidity of the dynamic damper in each spatial direction, but as this adjustment is difficult, it is sometimes impossible to sufficiently suppress the vibration attributable to the gradient coil. Especially when the subject is to be scanned in a pulse sequence in which the gradient magnetic field is switched at high speed, vibration attributable to the gradient coil might actualize such troubles as the occurrence of noise or the deterioration of the image quality.

SUMMARY OF THE INVENTION

Therefore, an object of the present invention is to provide a magnetic resonance imaging apparatus and a magnetic field forming apparatus permitting effective suppression of vibration attributable to the gradient coil, and capable of preventing the occurrence of noise to improve the image quality.

In order to achieve the object stated above, a magnetic resonance imaging apparatus according to the invention is a magnetic resonance imaging apparatus which generates an image of a subject on the basis of magnetic resonance signals from the subject in an accommodating space wherein a magnetostatic field is formed. This magnetic resonance imaging apparatus has a gradient coil unit being provided in the accommodating space and forming a gradient magnetic field in the accommodating space, and a dynamic damper which damps the vibration of the gradient coil unit, wherein the gradient coil unit is provided with an extending area which so extends as to protrude out of the accommodating space, and the dynamic damper is arranged in a position which is the extending area and which is different position from the accommodating space.

In order to achieve the object stated above, a magnetic field forming apparatus according to the invention is a magnetic field forming apparatus which forms a magnetic field in an accommodating space in which a subject is accommodated and a magnetostatic field is formed. This magnetic field forming apparatus has a gradient coil unit provided in the accommodating space and forming a gradient magnetic field in the accommodating space, and a dynamic damper which damps the vibration of the gradient coil unit, wherein the gradient coil unit is provided with an extending area which so extends as to protrude out of the accommodating space, and the dynamic damper is arranged in a position which is the extending area and which is different position from the accommodating space.

According to the invention, it is possible to provide a magnetic resonance imaging apparatus and a magnetic field forming apparatus permitting effective suppression of vibration attributable to the gradient coil, and capable of preventing the occurrence of noise to improve the image quality.

Further objects and advantages of the present invention will be apparent from the following description of the preferred embodiments of the invention as illustrated in the accompanying drawings.

BRIEF DESCRIPTION OF THE INVENTION

FIG. 1 is a drawing which shows the configuration of the magnetic resonance imaging apparatus 1 in this mode for implementing the present invention.

FIG. 2 are drawings which show the configuration of the magnetic resonance imaging apparatus 1 in this mode for implementing the invention, wherein FIG. 2(a) is a profile showing the part of the gradient coil unit 13 and FIG. 2(b), a perspective view showing the part of the gradient coil unit 13.

DETAILED DESCRIPTION OF THE INVENTION

Such a mode for implementing the present invention will be described below.

FIG. 1 and FIG. 2 are drawings which show a magnetic resonance imaging apparatus 1 in this mode for implementing the invention.

Figure 2A:
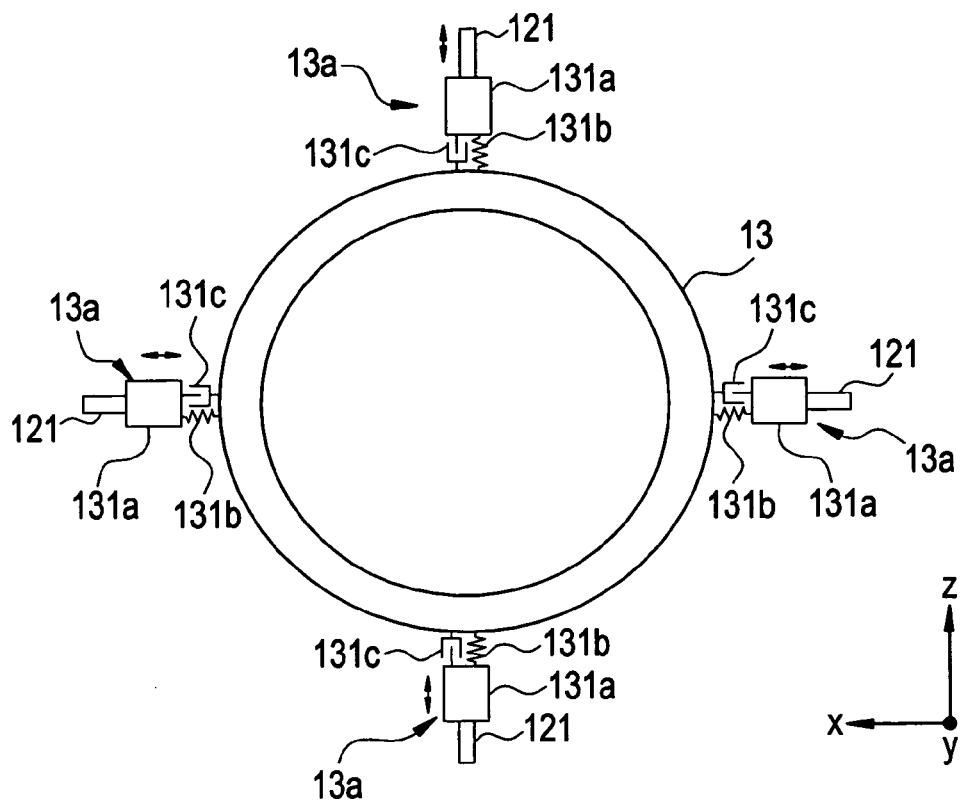
Figure 2B:
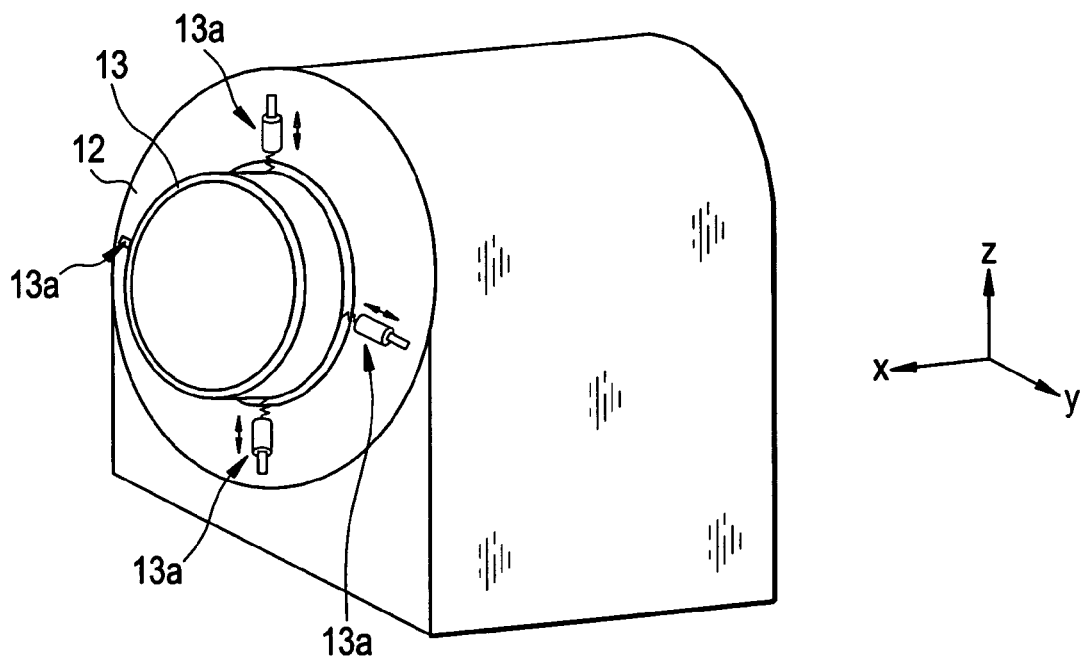

FIG. 1 here is a drawing which shows the configuration of the magnetic resonance imaging apparatus 1 in the mode for implementing the invention. FIG. 2 are drawings which show the configuration of the magnetic resonance imaging apparatus 1, wherein FIG. 2(a) is a profile showing the part of a gradient coil unit 13 and FIG. 2(b), a perspective view showing the part of the gradient coil unit 13.

As shown in FIG. 1, the magnetic resonance imaging apparatus 1, having a magnetostatic field magnet unit 12, the gradient coil unit 13, dynamic dampers 13a, an RF coil unit 14, an RF drive unit 22, a gradient drive unit 23, a data collecting unit 24, a control unit 25, a cradle 26, a data processing unit 31, an operating unit 32, and a display unit 33, irradiates a subject SU in an accommodating space B with an electromagnetic wave, performs scanning to obtain magnetic resonance signals from that subject SU, and generates an image of the subject SU on the basis of the magnetic resonance signals obtained by this scanning.

Each constituent element of the magnetic resonance imaging apparatus 1 in this mode for implementation will be successively described below.

The magnetostatic field magnet unit 12, comprising a superconducting magnet, forms a magnetostatic field in the accommodating space B in which the subject SU is accommodated. The magnetostatic field magnet unit 12 forms a magnetostatic field in the horizontal direction along the extending direction of a hollow part in the accommodating space B which is cylindrically shaped for instance. Incidentally, the magnetostatic field magnet unit 12 may as well be so configured as to comprise a magnet, such as a normally conducting magnet.

Also, guide rails 121 are formed in the magnetostatic field magnet unit 12 as shown in FIG. 1. The guide rails 121 slidably support the weights 131a of the dynamic dampers 13a. Here, as shown in FIG. 2, the plurality of guide rails 121 are so installed along the magnetostatic field magnet unit 12 as to match the respective weights 131a of the plurality of dynamic dampers 13a provided around the gradient coil unit 13. Each of the guide rails 121 is so formed as to radially extend from the circle center axis C of the columnar-shaped accommodating space B in the perpendicular radial direction r.

In this mode for implementation, as shown in FIG. 2(a), four guide rails 121 are installed on the side face of one opening side of the accommodating space B. And as shown in FIG. 1, guide rails 121 are similarly installed on the side face of the other opening side of the accommodating space B. Thus in this mode for implementation, a total of eight guide rails 121 are installed on the side faces of the magnetostatic field magnet unit 12 in different positions of the accommodating space B. More specifically, as shown in FIG. 2(a), on one opening side of the accommodating space B, two guide rails 121 are so installed along the magnetostatic field magnet 12 as to extend in the vertical direction z, which is vertical in the radial direction r of the accommodating space B, and support the weights 131a of the dynamic dampers 13a to be slidable in the vertical direction z. Further, two guide rails 121 are so installed along the magnetostatic field magnet 12 as to extend in the horizontal direction x, which is horizontal in the radial direction r of the accommodating space, and support the weights 131a of the dynamic dampers 13a to be slidable in this horizontal direction x. Similarly on the other opening side of the accommodating space B, a total of four guide rails 121 are installed.

The gradient coil unit 13 forms a gradient magnetic field in the accommodating space B in which a magnetostatic field is formed, and adds positional information to the magnetic resonance signals received by the RF coil unit 14. The gradient coil unit 13 comprises three lines of gradient coils so as to generate gradient magnetic fields grading in three mutually orthogonal axial directions, and these gradient coils are supported by cylindrically shaped gradient coil supports surrounding the columnar-shaped accommodating space B. The gradient coil unit 13, so as to be arranged in the accommodating space B, is so supported by the magnetostatic field magnet unit 12 at two ends, for instance, and other parts than the two ends are set apart from the magnetostatic field magnet unit 12. The gradient coil unit 13, as shown in FIG. 1 and FIG. 2(b), is so formed as to be longer than the magnetostatic field magnet unit 12 in the direction of the circle center axis C of the accommodating space B along the body axis direction y of the subject SU to be accommodated in the accommodating space B, and has extending areas P so extending as to protrude out of the openings at the two ends of the accommodating space B. And the gradient coil unit 13 forms a gradient magnetic field in each of the frequency encoding direction, phase encoding direction, and slice selecting direction according to the image pickup conditions. More specifically, the gradient coil unit 13 applies a gradient magnetic field in the slice selecting direction of the subject SU, and selects a slice of the subject SU excited by the transmission of an RF pulse by the RF coil unit 14. Also, the gradient coil 13 applies a gradient magnetic field in the phase encoding direction of the subject SU and subjects to phase encoding magnetic resonance signals from the slice excited by the RF pulse. And the gradient coil unit 13 applies a gradient magnetic field in the frequency encoding direction of the subject SU and subjects to frequency encoding magnetic resonance signals from the slice excited by the RF pulse.

The dynamic dampers 13a, as shown in FIG. 1, so arranged in the extending areas P of the gradient coil unit 13 as to be different from the accommodating space B, damp the vibration of the gradient coil unit 13. The dynamic dampers 13a, resonating with the vibration generated when the gradient coil unit 13 forms a gradient magnetic field in the accommodating space B, cancel the vibration of the gradient coil unit 13. In this mode for implementation, the dynamic dampers 13a are arranged to a position which is the extending areas P extending outward from the openings at the two ends of the accommodating space B as shown in FIG. 1, and are arranged on the outer circumferential walls of the cylindrically shaped gradient coil unit 13. Here, as shown in FIG. 2(a) and FIG. 2(b), four dynamic dampers 13a are installed on one opening side of the accommodating space B. More specifically, two dynamic dampers 13a are so installed as to be in the vertical direction z, which is vertical in the radial direction r of the accommodating space B to be aligned via the accommodating space B. And further, together with them, two dynamic dampers 13a are so installed as to be in the horizontal direction x, which is horizontal in the radial direction r of the accommodating space B, via the accommodating space B. Also, as shown in FIG. 1, dynamic dampers 13a are similarly installed on the other opening side of the accommodating space B. Thus, a total of eight dynamic dampers 13a are installed in this mode for implementation.

And the dynamic dampers 13a, as shown in FIG. 1 and FIG. 2(a), have the weights 131a, elastic members 131b and damping elements 131c.

The weights 131a of the dynamic dampers 13a are formed of a metallic material, for instance, to have prescribed masses. And the weights 131a, as shown in FIG. 1, are supported by the guide rails 121 to be slidable in a prescribed direction. For example, grooves are formed in the dynamic dampers 13a along the extending direction of the guide rails 121, and those grooves are fit onto the guide rails 121 to enable them to slide in the extending direction of the guide rails 121. More specifically, as shown in FIG. 2(a), each of the weights 131a of the two dynamic dampers 13a installed in the vertical direction z on the side of one opening of the accommodating space B is supported to be slidable in the vertical direction z by the guide rails 121 installed in the magnetostatic field magnet 12 to extend in the vertical direction z. Each of the weights 131a of the two dynamic dampers 13a installed in the horizontal direction x, which is horizontal in the radial direction r of the cylindrically shaped accommodating space B, is supported to be slidable in this horizontal direction x by the guide rails 121 installed to extend in the magnetostatic field magnet 12. Four dynamic dampers 13a are similarly installed on the other opening side of the accommodating space B.

The elastic members 131b of the dynamic dampers 13a comprise coil springs for instance and, so arranged to be held between the weights 131a and the gradient coil unit 13, connect the weights 131a and the gradient coil unit 13.

The damping elements 131c of the dynamic dampers 13a comprise oil cylinders for instance and, so arranged to be held between the weights 131a and the gradient coil unit 13, connect the weights 131a and the gradient coil unit 13 to each other.

In the dynamic dampers 13a, each of the weights 131a, the elastic members 131b and the damping elements 131c is so formed, as indicated by Equation (1), Equation (2) and Equation (3), as to have a mass m2, a spring constant k2 and a damping constant c2 matching the resonance frequency of the gradient coil unit 13 to each other.

Incidentally in Equation (1), Equation (2) and Equation (3), $\mu$ represents the mass ratio, $\omega 1$, the natural frequency of the gradient coil unit 13 and m1, the equivalent mass of the gradient coil unit 13 matching the natural frequency $\omega 1$. The mass ratio $\mu$ here can be represented by Equation (4). Further, the natural frequency $\omega 1$ of the gradient coil unit 13 is represented by Equation (5) using the equivalent mass m1 and the elastic modulus k1 of the gradient coil unit 13.

In Equation (1), Equation (2) and Equation (3), $\omega 2$ is the natural frequency of the dynamic dampers 13a, $\gamma opt$, the optimal natural frequency ratio, and $\zeta 2opt$, the optimal damping ratio. Here, the natural frequency $\omega 2$ of the dynamic dampers 13a is represented by Equation (6) using the equivalent mass m2 and the elastic modulus k2 of the dynamic dampers 13a. And the optimal natural frequency $\gamma opt$ is represented by Equation (8) using the damping ratio $\zeta 1$ of the gradient coil unit 13 represented by Equation (7). And the optimal damping ratio $\zeta 2opt$ is represented by Equation (9).

$$m2 = \mu \cdot m1 \quad (1)$$

$$K2 = m2 \cdot \omega 2^2 = m2 \cdot (\gamma opt 1 \cdot \omega 1)^2 \quad (2)$$

$$C2 = \zeta 2opt \cdot 2 \cdot m2 \cdot \omega 2 \quad (3)$$

$$\mu = \frac{m2}{m1} \quad (4)$$

$$\omega 1 = \sqrt{\frac{k1}{m1}} \quad (5)$$

$$\omega 2 = \sqrt{\frac{k2}{m2}} \quad (6)$$

$$\xi 1 = \frac{C1}{2 \cdot m1 \cdot \omega 1} \quad (7)$$

$$\gamma opt = \frac{\omega 2}{\omega 1} = \frac{1}{1+\mu}\left(1 - \xi 1 \cdot \sqrt{\frac{\mu}{1+\mu-\xi 1^2}}\right) \quad (8)$$

$$\xi 2opt = \frac{\xi 1 + \sqrt{\mu \cdot (1 + \mu - \xi 1^2)}}{1 + \mu} \quad (9)$$

In setting the mass m2, the spring constant k2 and the damping constant c2 in the dynamic dampers 13a, first the equivalent mass m1 is figured out regarding the natural vibration mode in which the vibration is reduced in the gradient coil unit 13. Here is used a mode analysis in which it is identified from the variation in natural frequency when the weight is loaded. Next, with respect to the mass m2 of the dynamic dampers 13a, a high value is set with a mass ratio $\mu$ of 0.1 as a rough measure. Then, with respect to the spring constant k2 of the dynamic dampers 13a, the optimal natural frequency ratio $\gamma opt$ determined by the mass ratio $\mu$ is figured out and determined. Next, with respect to the damping constant c2 of the dynamic dampers 13a, the optimal damping ratio $\zeta 2opt$ determined by the mass ratio $\mu$ is figured out and determined. And further, on the basis of the mass 2, the spring constant k2 and the damping constant c2, sensitivity analysis is performed with the noise level as the objective function and optimized by varying the value within the range in which designing is possible.

The RF coil unit 14, as shown in FIG. 1, is so arranged as to surround the image pickup area of the subject SU. The RF coil unit 14 forms a high frequency magnetic field by transmitting to the subject SU an RF pulse, which is an electromagnetic wave, in the accommodating space B wherein a magnetostatic field is formed by the magnetostatic field magnet unit 12, and excites the spinning of protons in the image pickup area of the subject SU. The RF coil unit 14 receives as magnetic resonance signals the electromagnetic wave generated from the excited protons in the subject SU.

The RF drive unit 22 drives the RF coil unit 14 to transmit the RF pulse into the accommodating space B, thereby to form the high frequency magnetic field. The RF drive unit 22 has a gate modulator (not shown), an RF power amplifier (not shown) and an RF oscillator (not shown). The RF drive unit 22, on the basis of a control signal from the control unit 25, modulates signals from the RF oscillator into signals of a prescribed timing and a prescribed envelope by using the gate modulator. It outputs the signals modulated by the gate modulator, after amplifying them with the RF power amplifier, to the RF coil unit 14, to transmit the RF pulse.

The gradient drive unit 23, on the basis of a control signal from the control unit 25, drives the gradient coil unit 13 by applying a gradient pulse to it, and causes a gradient magnetic field to be generated in the accommodating space B in which a magnetostatic field is formed. The gradient drive unit 23 has three lines of drive circuits (not shown) matching the three lines of gradient coil units 13.

The data collecting unit 24, on the basis of a control signal from the control unit 25, collects magnetic resonance signals received by the RF coil unit 14, and outputs them to the data processing unit 31. The data collecting unit 24 collects magnetic resonance signals subjected to phase encoding and frequency encoding to match k spaces. Here, after a phase detector phase-detects magnetic resonance signals received by the RF coil unit 14, with the output of the RF oscillator of the RF drive unit 22 as a reference signal, the data collecting unit 24 causes an A/D converter to convert those analog magnetic resonance signals into digital signals. And, after storing the collected magnetic resonance signals into a memory, it outputs them to the data processing unit 31.

The control unit 25 has a computer and a program which causes each unit to execute an operation matching prescribed scanning by using the computer. And the control unit 25, on the basis of an operation signal inputted from the operating unit 32 via the data processing unit 31, performs control by outputting a control signal to cause prescribed scanning to be executed to each of the RF drive unit 22, the gradient drive unit 23 and the data collecting unit 24.

The cradle 26, as shown in FIG. 1, has a table on which the subject SU is to be mounted. The cradle unit 26, on the basis of a control signal from the control unit 25, moves the subject mounted on the table between inside and outside the accommodating space B. Here, the subject SU is moved along the direction of the circle center axis C of the columnar-shaped accommodating space B.

The data processing unit 31 has a computer and a program which causes each unit to execute prescribed data processing by using the computer. Operation signals from the operating unit 32 are inputted to the data processing unit 31, which is connected to the operating unit 32. And the data processing unit 31 is connected to the control unit 25, and outputs to the control unit 25 operation signals inputted by the operator to the operating unit 32. Also, the data processing unit 31 is connected to the data collecting unit 24, acquires magnetic resonance signals collected by the data collecting unit 24, and generates an image regarding a slice of the subject SU by subjecting the acquired magnetic resonance signals to image processing. For instance, the data processing unit 31 subjects to Fourier transform magnetic resonance signals converted into digital signals to generate an image of the subject SU. And the data processing unit 31 outputs the generated image to the display unit 33.

The operating unit 32 is composed of an operating device, such as a keyboard or a mouse. The operating unit 32 is operated by the operator, and outputs operation signals according to his or her operation to the data processing unit 31. Here, the operating unit 32 is so configured as to enable the operator to select and input scanning out of a plurality of pulse sequences matching different purposes of imaging.

The display unit 33 is composed of a display device, such as a CRT. The display unit 33 displays an image regarding a slice of the subject SU generated on the basis of magnetic resonance signals from the subject SU.

As described above, in the magnetic resonance imaging apparatus 1 in this mode for implementation, the dynamic dampers 13a are installed in the gradient coil unit 13. For this reason, vibration attributable to the gradient coil unit 13 can be suppressed.

Figure 3A:
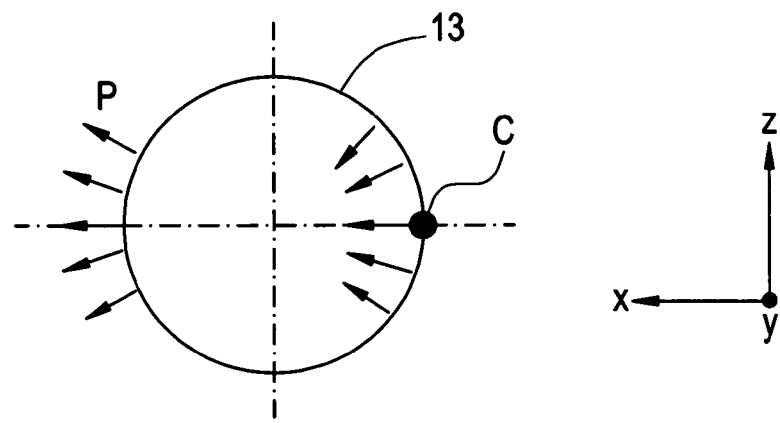
FIGS. 3a and 3b are diagrams showing the positions of simulation of the displacement (Disp.) of the gradient coil unit 13 relative to frequencies of a prescribed range (Freq. (Hz)) in this mode for implementing the invention.
Figure 3B:
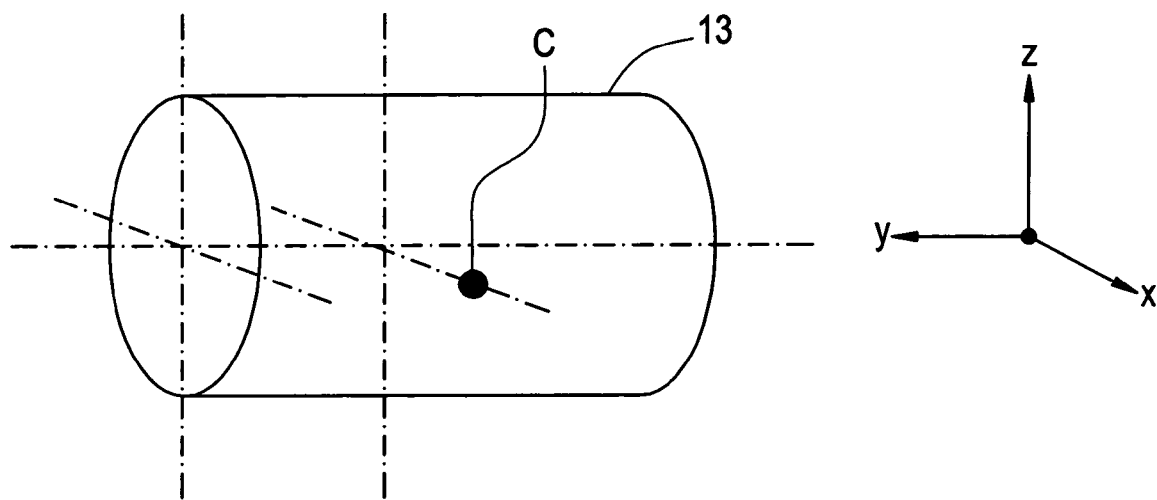
Figure 4:
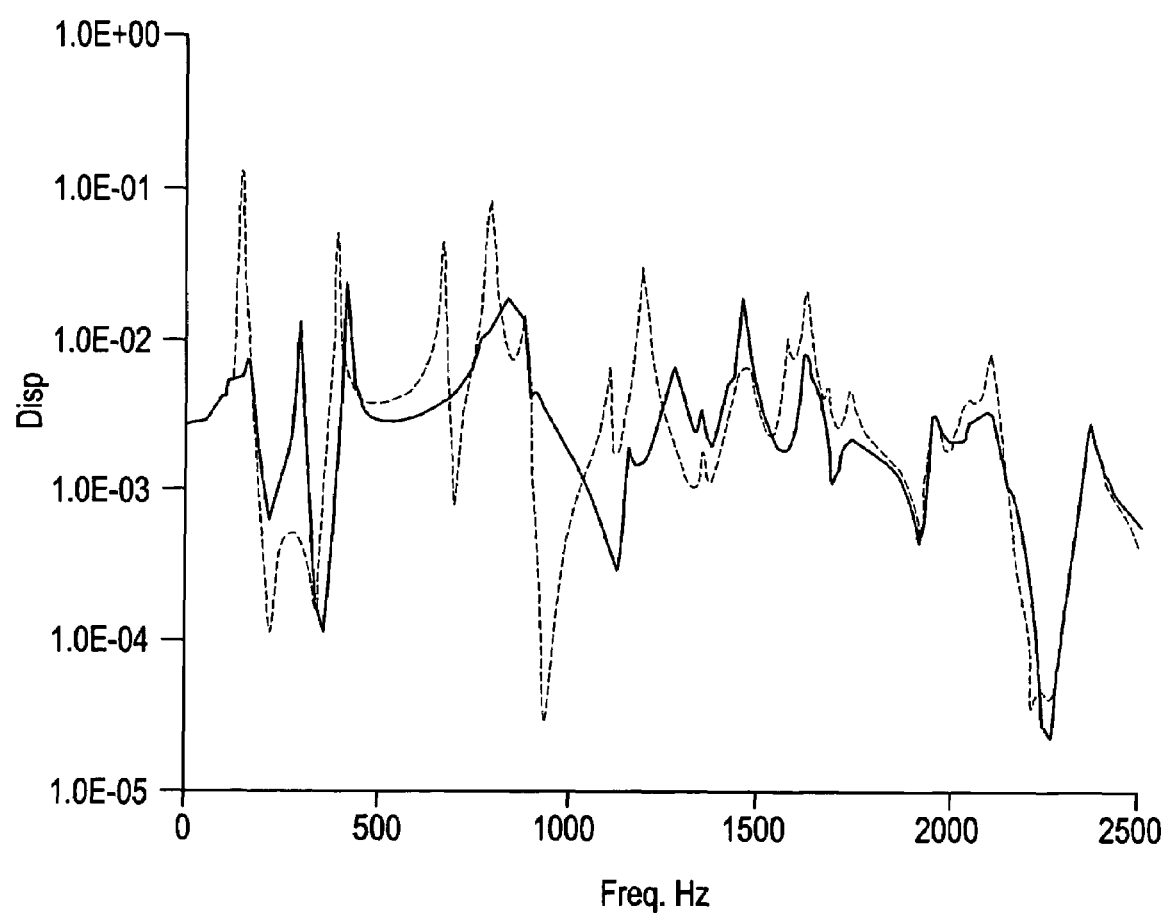
FIG. 4 is a diagram showing the result of simulation of the displacement (Disp.) of the gradient coil unit 13 relative to frequencies of the prescribed range (Freq. (Hz)) in this mode for implementing the invention.

FIG. 3 are diagrams showing the positions of simulation of the displacement (Disp.) of the gradient coil unit 13 relative to frequencies of a prescribed range (Freq. (Hz)) in this mode for implementing the invention. In FIG. 3, FIG. 3(a) is a front view showing the position of simulation of the displacement (Disp.) of the gradient coil unit 13 relative to frequencies of the prescribed range (Freq. (Hz)), and FIG. 3(b), a perspective view showing this position of simulation. FIG. 4 is a diagram showing the result of simulation of the displacement (Disp.) of the gradient coil unit 13 relative to the frequencies of the prescribed range (Freq. (Hz)), wherein solid lines represent the case of this mode for implementation wherein the dynamic dampers 13a is installed and dotted lines represent the case in which the dynamic dampers 13a are not installed and the unit is fixed.

In this mode for implementation, as shown in FIG. 3(a) and FIG. 3(b), the displacement (Disp.) in the central part (C) of the vibrated range, which is the center of the cylinder face in the gradient coil unit 13 to which a vibromotive force P distributed in the horizontal direction is applied, is simulated. As is seen from the result of simulation shown in FIG. 4, the installation of the dynamic dampers 13a in the gradient coil unit 13 serves to suppress the vibration attributable to the gradient coil unit 13.

Further, in the magnetic resonance imaging apparatus 1 in this mode for implementation, the gradient coil unit 13 which constitutes a gradient magnetic field in the columnar accommodating space is so formed in a cylindrical shape as to surround the accommodating space B, and has the extending areas P which so extend as to protrude out of the openings of the accommodating space B in the direction of the circle center axis C of this accommodating space B. And the dynamic dampers 13a which damp the vibration of the gradient coil unit 13 are installed in the extending areas P on the outer circumferential walls of the gradient coil unit 13, and arranged in different positions from the accommodating space B. As a result, in this mode for implementation, since a sufficient space for the installation of the dynamic dampers 13a can be secured, the masses of the weights 131a of the dynamic dampers 13a can be increased, and the vibration attributable to the gradient coil unit 13 can be adequately suppressed. Therefore, this mode for implementation can contribute to preventing the vibration attributable to the gradient coil unit 13 from generating noise and thereby to improve the image quality.

Further in the magnetic resonance imaging apparatus 1 in this mode for implementation, the guide rails 121 to slidably support the weights 131a of the dynamic dampers 13a are installed in the magnetostatic field magnet unit 12. As a result, the vibration of the gradient coil unit 13 causes the weights 131a of the dynamic dampers 13a to resonate in the extending direction of the guide rails 121. Therefore, this mode for implementation can adequately suppress the vibration attributable to the gradient coil unit 13, and thereby prevent the vibration of the gradient coil unit 13 from generating noise and improve the image quality.

To add, the magnetic resonance imaging apparatus 1 in this mode for implementation corresponds to a magnetic resonance imaging apparatus according to the present invention. Also, the magnetostatic field magnet unit 12 in this mode for implementation corresponds to a magnetostatic field magnet unit according to the invention. Also, the gradient coil unit 13 in this mode for implementation corresponds to a gradient coil unit according to the invention. Also, the dynamic dampers 13a in this mode for implementation correspond to dynamic dampers according to the invention. Also, the guide rails 121 in this mode for implementation correspond to guide rails according to the invention. Also, the weights 131a correspond to weights according to the invention. Also, the elastic members 131b in this mode for implementation correspond to elastic members according to the invention. Also, the extending areas P in this mode for implementation correspond to extending areas according to the invention. Also, the accommodating space B in this mode for implementation corresponds to an accommodating space according to the invention.

Further, implementation of the present invention is not limited to the above-described mode for implementation, but various other modifications can be adopted.

For instance, as the elastic members 131b and the damping elements 131c of the dynamic dampers 13a, visco-elastic members of coil springs and rubber or the like can be used in combination, or a single visco-elastic member of rubber or the like can be used.

For example, regarding the dynamic dampers 13a, it is conceivable, in the vertical direction z, to install no dynamic damper 13a underneath the accommodating space B but to install dynamic dampers 13a only above the accommodating space B. Other possible applications include, for instance, a case of using one dynamic damper 13a.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus which generates an image of a subject on the basis of magnetic resonance signals from the subject in an accommodating space wherein a magnetostatic field is formed, the magnetic resonance imaging apparatus comprising:
   a gradient coil device, provided in said accommodating space, and forming a gradient magnetic field in said accommodating space; and
   a dynamic damper which damps the vibration of said gradient coil device,
   wherein:
      said gradient coil device is provided with an extending area which so extends as to protrude out of said accommodating space; and
      said dynamic damper is arranged in a position which is said extending area and which is different position from said accommodating space.

2. The magnetic resonance imaging apparatus according to claim 1, further comprising:
   a magnetostatic field magnet device which forms said magnetostatic field in said accommodating space,
   said dynamic damper comprising:
      a weight; and
      an elastic member and a damping element which connect said weight and said gradient coil device to each other,
   wherein guide rails to slidably support said weight are provided in said magnetostatic field magnet device.

3. The magnetic resonance imaging apparatus according to claim 2, said dynamic damper being formed such that:
   said weight is so formed as to have a mass matching the resonance frequency of said gradient coil device; and
   said elastic member and said damping element are so formed as to respectively have a spring constant and a damping constant matching the resonance frequency of said gradient coil device.

4. The magnetic resonance imaging apparatus according to claim 1, wherein:
   said gradient coil device is formed in a cylindrical shape surrounding said accommodating space of a columnar shape, said extending area extends outward from an opening in said accommodating space in the direction of the circle center axis of said accommodating space; and
   said dynamic damper is arranged in said extending area on the outer circumferential wall of said gradient coil device.

5. A magnetic field forming apparatus which forms a magnetic field in an accommodating space in which a subject is accommodated and a magnetostatic field is formed, the magnetic field forming apparatus comprising:
   a gradient coil device, provided in said accommodating space, and forming a gradient magnetic field in said accommodating space; and
   a dynamic damper which damps the vibration of said gradient coil device,
   wherein:
      said gradient coil device is provided with an extending area which so extends as to protrude out of said accommodating space; and
      said dynamic damper is arranged in a position which is said extending area and which is different position from said accommodating space.

6. The magnetic field forming apparatus according to claim 5, further comprising:
   a magnetostatic field magnet device which forms a magnetostatic field in said accommodating space,
   said dynamic damper comprising:
      a weight; and
      an elastic member and a damping element which connect said weight and said gradient coil device to each other,
   wherein guide rails to slidably support said weight are provided in said magnetostatic field magnet device.

7. The magnetic field forming apparatus according to claim 6, said dynamic damper being formed such that:
   said weight is so formed as to have a mass matching the resonance frequency of said gradient coil device; and
   said elastic member and said damping element are so formed as to respectively have a spring constant and a damping constant matching the resonance frequency of said gradient coil device.

8. The magnetic field forming apparatus according to claim 5, wherein:
   said gradient coil device is formed in a cylindrical shape surrounding said accommodating space of a columnar shape, said extending area extends outward from an opening in said accommodating space in the direction of the circle center axis of said accommodating space; and
   said dynamic damper is arranged in said extending area on the outer circumferential wall of said gradient coil device.

* * * * *